(12) United States Patent
Yasui et al.

(10) Patent No.: US 11,443,918 B2
(45) Date of Patent: Sep. 13, 2022

(54) CHARGED PARTICLE BEAM WRITING METHOD AND CHARGED PARTICLE BEAM WRITING APPARATUS

(71) Applicant: NuFlare Technology, Inc., Yokohama (JP)

(72) Inventors: Kenichi Yasui, Kawasaki (JP); Yasuo Kato, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 271 days.

(21) Appl. No.: 16/831,916

(22) Filed: Mar. 27, 2020

(65) Prior Publication Data

US 2020/0357604 A1 Nov. 12, 2020

(30) Foreign Application Priority Data

May 8, 2019 (JP) .............................. JP2019-088439

(51) Int. Cl.
*H01J 37/317* (2006.01)
*G03F 7/20* (2006.01)
*H01J 37/244* (2006.01)

(52) U.S. Cl.
CPC ........ *H01J 37/3174* (2013.01); *G03F 7/2037* (2013.01); *H01J 37/244* (2013.01)

(58) Field of Classification Search
CPC ............... H01J 37/3174; H01J 37/244; H01J 2237/31769; H01J 2237/31776; H01J 37/3026; H01J 37/3177; H01J 37/3045; G03F 7/2037; G03F 1/86; G03F 7/70558;
(Continued)

(56) References Cited

U.S. PATENT DOCUMENTS 5,051,598 A * 9/1991 Ashton ............... H01J 37/3026
250/492.1
6,035,113 A * 3/2000 Gerber ............... H01J 37/3023
716/53
(Continued)

FOREIGN PATENT DOCUMENTS

| JP | 11-204415 A | 7/1999 |
| JP | 2004-140311 A | 5/2004 |
| JP | 2009-033025 A | 2/2009 |

*Primary Examiner* — David A Vanore
(74) *Attorney, Agent, or Firm* — Oblon, McClelland, Maier & Neustadt, L.L.P.

(57) ABSTRACT

In one embodiment, a charged particle beam writing method includes virtually dividing a writing region of the substrate into a plurality of first mesh regions in a first mesh size, calculating an area density of the pattern for each of the plurality of first mesh regions to generate first mesh data, converting a mesh size of the first mesh data into a second mesh size greater than the first mesh size to generate second mesh data, performing a convolution operation between the second mesh data and a proximity effect correction kernel to generate third mesh data, converting a mesh size of the third mesh data into the first mesh size to generate fourth mesh data, performing a convolution operation between the first mesh data and a middle range effect correction kernel to generate fifth mesh data, and adding the fourth mesh data and the fifth mesh data together to calculate an irradiation amount of the charged particle beam for each of the plurality of first mesh regions.

12 Claims, 6 Drawing Sheets

(58) Field of Classification Search
CPC ... G03F 7/2059; G03F 7/2061; G03F 7/70441
See application file for complete search history.

(56) References Cited

U.S. PATENT DOCUMENTS

| | | | | |
|---|---|---|---|---|
| 8,552,405 | B2* | 10/2013 | Kato | H01J 37/3174 |
| | | | | 250/397 |
| 2008/0052334 | A1* | 2/2008 | Yamazoe | G06F 30/00 |
| | | | | 708/403 |
| 2008/0120073 | A1* | 5/2008 | Hara | G03F 1/36 |
| | | | | 703/6 |
| 2009/0032739 | A1 | 2/2009 | Kawase | |
| 2009/0057575 | A1* | 3/2009 | Oogi | H01J 37/3174 |
| | | | | 250/492.22 |
| 2011/0121208 | A1* | 5/2011 | Nakayamada | H01J 37/3174 |
| | | | | 250/492.22 |
| 2013/0099139 | A1* | 4/2013 | Kato | H01J 37/3174 |
| | | | | 250/492.3 |
| 2017/0278672 | A1* | 9/2017 | Suganuma | H01J 37/3026 |
| 2018/0090299 | A1* | 3/2018 | Nakayamada | H01J 37/3026 |
| 2018/0114673 | A1* | 4/2018 | Matsumoto | H01J 37/3177 |
| 2019/0362937 | A1* | 11/2019 | Nakayamada | H01J 37/244 |
| 2020/0357604 | A1* | 11/2020 | Yasui | H01J 37/3174 |
| 2020/0357605 | A1* | 11/2020 | Yasui | G03F 7/2037 |

* cited by examiner

$$\frac{D(x)}{2} + \eta \int_{pattern} D(x')g(x-x')dx' = E_0 \qquad E_0: \text{IRRADIATION AMOUNT THRESHOLD}$$

$$g(x) = c\left\{\underbrace{\sum_n \frac{\eta_{pn}}{\pi\sigma_{pn}^2}\exp\left(-\frac{(x-x')^2}{\sigma_{pn}^2}\right)}_{\text{PROXIMITY EFFECT CORRECTION KERNEL}} + \underbrace{\sum_q \frac{\eta_{mgs}}{\pi\sigma_{mgs}^2}\exp\left(-\frac{(x-x')^2}{\sigma_{mgs}^2}\right) + \sum_k \frac{\eta_{mek}}{\pi\sigma_{mek}^2}\exp\left(-\frac{(x-x')}{\sigma_{mek}}\right)}_{\text{ADDITIONAL PART FOR MIDDLE RANGE EFFECT}}\right\}$$

$\eta_{pn}$: back-scattering ratio for PEC
$\sigma_{pn}$: back-scattering width for PEC
$\eta_{mgs}$: gaussian middle range effect ratio
$\sigma_{mgs}$: gaussian middle range effect width
$\eta_{mek}$: exponential MEC ratio
$\sigma_{mek}$: exponential middle range effect width $$c = \frac{1}{\eta} \qquad \eta = \sum_n \eta_{pn} + \sum_q \eta_{mgs} + \sum_k \eta_{mek}$$

Fig. 9

CHARGED PARTICLE BEAM WRITING METHOD AND CHARGED PARTICLE BEAM WRITING APPARATUS

CROSS REFERENCE TO RELATED APPLICATION

This application is based upon and claims benefit of priority from the Japanese Patent Application No. 2019-88439, filed on May 8, 2019, the entire contents of which are incorporated herein by reference.

FIELD

The present invention relates to a charged particle beam writing method and a charged particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a photomask pattern is employed. A highly precise original image pattern is written by using an electron beam writing apparatus, in which a technology commonly known as electron beam lithography is used.

In electron beam writing, the influence of so-called proximity effect causes a problem in that dimensional variation occurs due to backscattered electrons. As one of methods for correcting the proximity effect, an irradiation amount correction method is known. This is a correction method by which an irradiation amount is determined for each position based on the size and density of a pattern in the surroundings of the beam irradiation position.

In the irradiation amount correction, a backscattering irradiation amount is calculated, where the backscattering occurs when an electron beam, with which a photomask is irradiated, is reflected by the mask, and a resist is exposed to the electron beam again. The calculation is sped up by using a sum of products (convolution) between a pattern density map and a gaussian kernel as a backscattering distribution function, the pattern density map representing information on a pattern within a layout by a mesh of several μm side, for instance.

Figure 9:
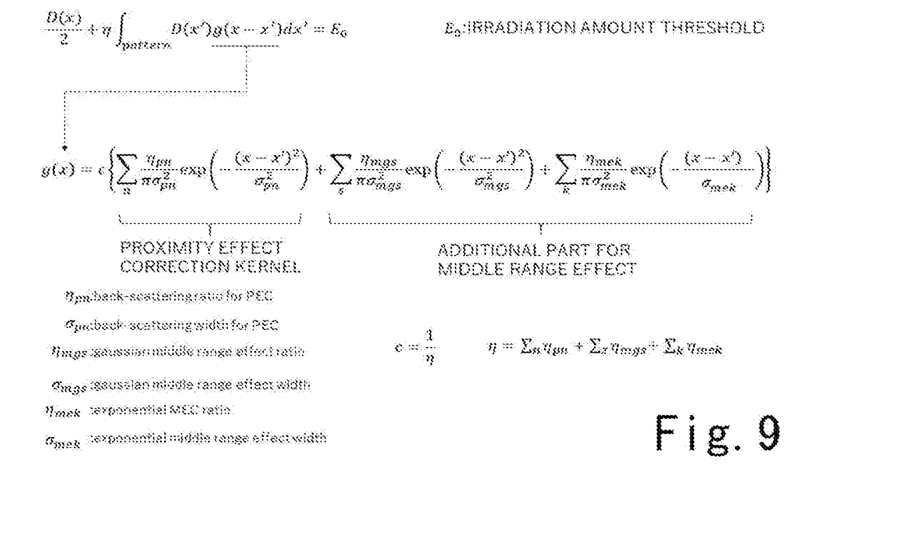
FIG. 9 is a figure illustrating an example of a calculation expression for the proximity effect correction and the middle range effect correction.

The influence range of the proximity effect is approximately 10 μm, and the calculation mesh size in the irradiation amount correction is approximately several μm. In addition, in recent years, there has been an increasing need for middle range effect correction that corrects a line width error due to backscattering and/or a process specific to an EUV substrate with an influence range of from several hundred nm to several μm. As illustrated in FIG. 9, the middle range effect correction can be performed by adding a middle range effect kernel to a conventional proximity effect correction method.

The sizes of the influence rages of the proximity effect and the middle range effect are close. When these effects are separately calculated independently, degradation of the accuracy of correction is caused, thus calculation needs to be performed in consideration of both effects. The calculation mesh size in the middle range effect correction is approximately several hundred nm, and when a kernel of approximately 10 μm is convoluted using a mesh size of an approximately several hundred nm, the amount of calculation is huge, thus it is difficult to perform calculation processing within a practical time.

DETAILED DESCRIPTION

In one embodiment, a charged particle beam writing method is for writing a pattern on a substrate using a charged particle beam in an irradiation amount to correct a proximity effect and a middle range effect having an influence radius shorter than an influence radius of the proximity effect. The method includes virtually dividing a writing region of the substrate into a plurality of first mesh regions in a first mesh size, calculating an area density of the pattern for each of the plurality of first mesh regions to generate first mesh data, converting a mesh size of the first mesh data into a second mesh size greater than the first mesh size to generate second mesh data, performing a convolution operation between the second mesh data and a proximity effect correction kernel to generate third mesh data, converting a mesh size of the third mesh data into the first mesh size to generate fourth mesh data, performing a convolution operation between the first mesh data and a middle range effect correction kernel to generate fifth mesh data, adding the fourth mesh data and the fifth mesh data together to calculate an irradiation amount of the charged particle beam for each of the plurality of first mesh regions, and writing the pattern on the substrate using the charged particle beam in the calculated irradiation amount.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
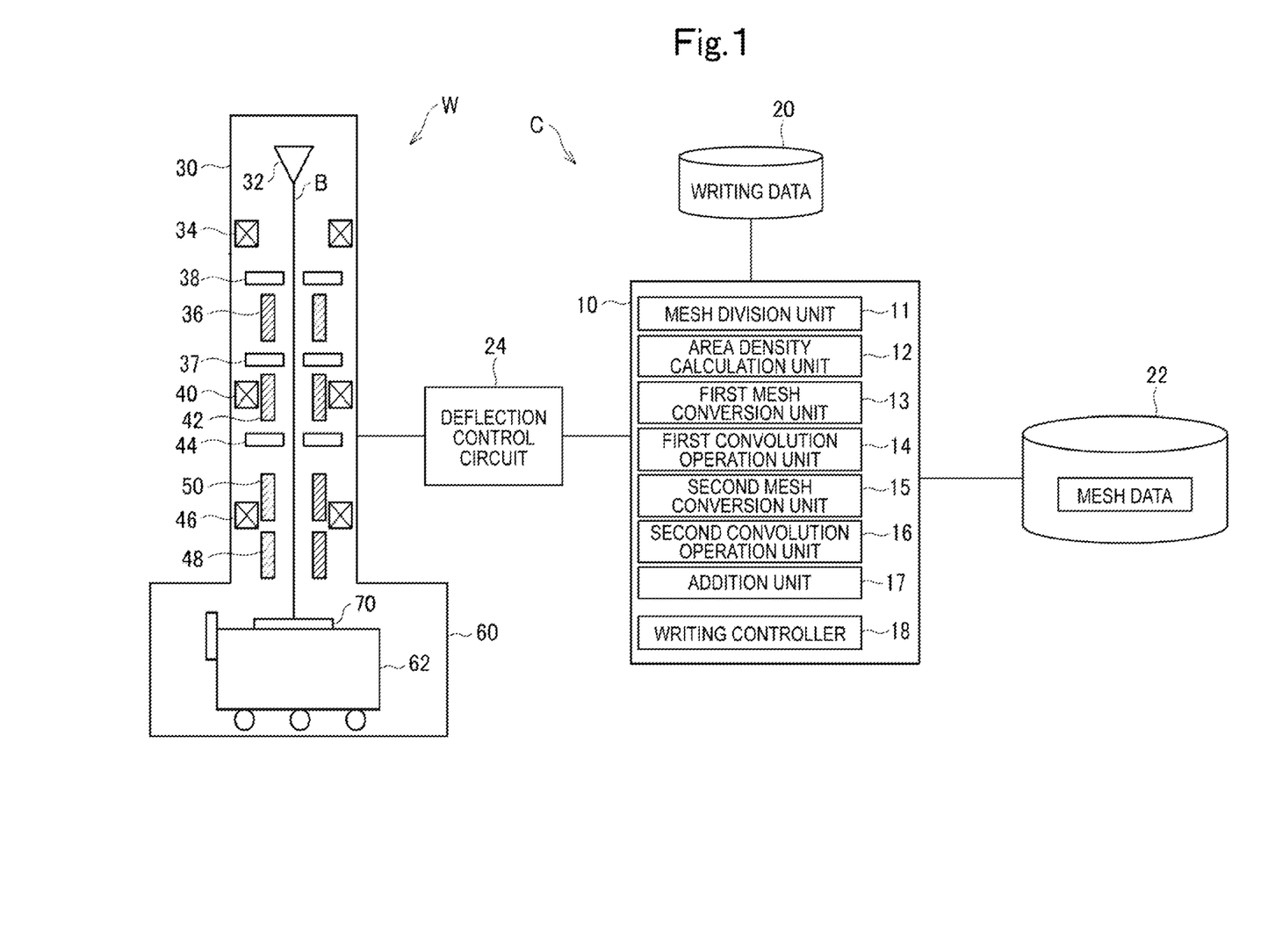
FIG. 1 is a schematic diagram of an electron beam writing apparatus according to an embodiment of the present invention.

FIG. 1 is a schematic diagram of an electron beam writing apparatus according to an embodiment of the present invention. The electron beam writing apparatus illustrated in FIG. 1 is a variable shaped beam writing apparatus including a controller C and a writer W.

The writer W includes a column 30 and a writing chamber 60. In the column 30, an electron gun 32, an illuminating lens 34, a blanker 36, a blanking aperture plate 37, a first shaping aperture plate 38, a projection lens 40, a shaping deflector 42, a second shaping aperture plate 44, an objective lens 46, a main deflector 48, and a sub-deflector 50 are disposed.

In the writing chamber 60, an XY stage 62 is disposed. A substrate 70 as a writing target is placed on the XY stage 62. The substrate 70 is a mask for exposure at the time of manufacturing a semiconductor device, or a semiconductor substrate (silicon wafer) on which a semiconductor circuit is written. Alternatively, the substrate 70 may be a mask blanks to which a resist is applied and on which nothing has been written yet.

Figure 2:
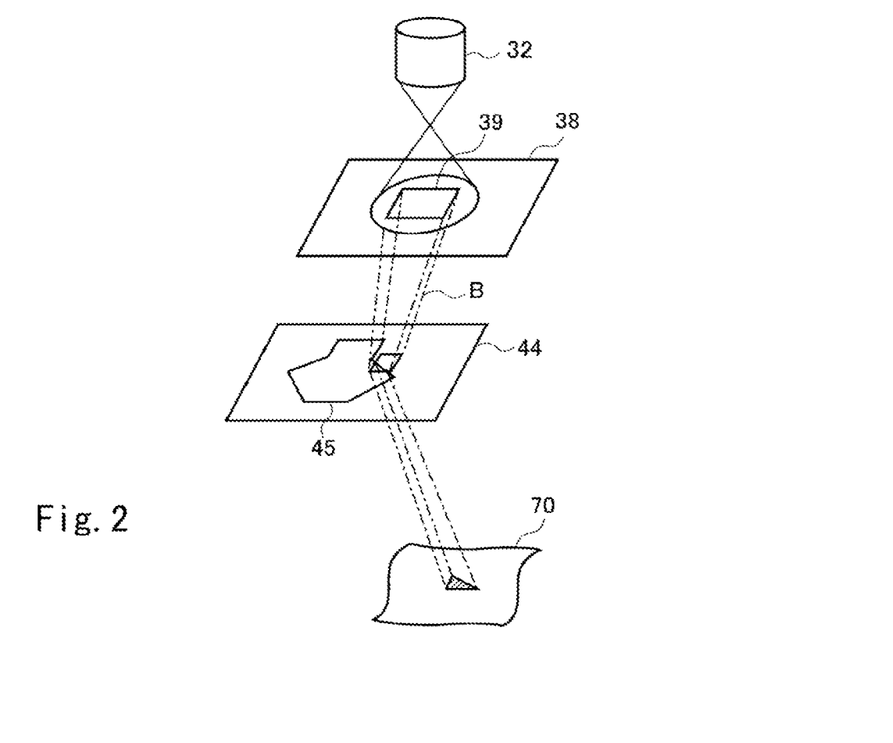
FIG. 2 is a perspective view of a first shaping aperture plate and a second shaping aperture plate.

The first shaping aperture plate 38 having a rectangular opening 39 (see FIG. 2) is irradiated with an electron beam B by the illuminating lens 34, the electron beam B being discharged from the electron gun 32 (discharge unit) provided in the column 30. The electron beam B is shaped into a rectangle by passing through the opening 39 of the first shaping aperture plate 38.

When the electron beam B having a first aperture image (rectangle), which has passed through the first shaping aperture plate 38, passes through the blanker 36 (blanking deflector), whether the substrate 70 is irradiated or not is switched by the blanker 36. When beam off is set by the blanker 36, the electron beam B is deflected so as to be shielded by the blanking aperture plate 37. When beam on is set, control is performed so that the electron beam B passes through the blanking aperture plate 37.

The electron beam B having the first aperture image (rectangle), which has passed through the blanking aperture plate 37, is projected on the second shaping aperture plate 44 having an opening 45 (see FIG. 2) by the projection lens 40. At this point, the first aperture image (rectangle) projected on the second shaping aperture plate 44 is deflection-controlled by the deflector 42, and the shape and size of the electron beam which passes through the opening 45 can be changed (variable shaping can be performed). In addition, when the electron beam B having the first aperture image (rectangle) is all controlled so as to pass through the opening 45 of the second shaping aperture plate 44, it is also possible not to change the shape and size of the electron beam having the first aperture image (rectangle).

The electron beam B having a second aperture image, which has passed through the opening 45 of the second shaping aperture plate 44, is focused by the objective lens 46, deflected by the main deflector 48 and the sub-deflector 50, and a target position of the substrate 70 placed on the XY stage 62 which moves continuously is irradiated with the electron beam B.

The controller C has a control computer 10, storage devices 20, 22, and a deflection control circuit 24. Writing data (layout data) including multiple graphic patterns is inputted from the outside and stored in the storage device 20.

The control computer 10 has a mesh division unit 11, an area density calculation unit 12, a first mesh conversion unit 13, a first convolution operation unit 14, a second mesh conversion unit 15, a second convolution operation unit 16, an addition unit 17, and a writing controller 18.

Each component of the control computer 10 may be configured by hardware such as an electrical circuit, or configured by software. When each component is configured by software, a program which implements at least part of the functions of the control computer 10 may be stored in a recording medium, and the program may be read and executed by a computer including an electrical circuit. The recording medium is not limited to a detachably medium such as a magnetic disk or an optical disk, and may be a fixed recording medium such as a hard disk drive or a memory.

The electron beam writing apparatus is used for pattern writing or the like on a photomask. For production of a photomask, a quartz substrate provided with a light-shielding film such as a chromium film, and a resist is first prepared, and a desired pattern is written on the resist by the electron beam writing apparatus. After the writing, an exposed portion (or an unexposed portion) of the resist is dissolved and removed by developing treatment, and a resist pattern is formed. Subsequently, the resist pattern is masked, dry etching processing is performed thereon by a dry etching device, and a light-shielding film is processed. After this, the resist is peeled off, and a photomask is produced.

In electron beam writing, a dimensional variation of a pattern occurs by the influence of proximity effect due to backscattered electrons, thus it is necessary to reduce the dimensional variation by correcting an irradiation amount. In addition, it is necessary to correct the middle range effect which has an influence range slightly smaller than that of the proximity effect, and causes a dimensional variation. In the present embodiment, proximity effect correction and middle range effect correction are performed efficiently.

The writing method including the proximity effect correction and the middle range effect correction will be described with reference to the flowchart illustrated in FIG. 3.

First, the mesh division unit 11 virtually divides a writing region on the substrate 70 into a plurality of mesh regions in a grid pattern (step 1). The mesh division unit 11 divides the writing region so as to achieve a small mesh size (a first mesh size, a small mesh size), for instance, approximately 100 nm, necessary for the middle range effect correction. Hereinafter a mesh region in the small mesh size is also referred to as a small mesh region.

Subsequently, the area density calculation unit 12 reads writing data from the storage device 20, assigns a graphic pattern to a corresponding small mesh region, and calculates a pattern area density of each small mesh region. Thus, first mesh data is obtained, in which the pattern area density (mesh value) of each small mesh region is defined. The first mesh data is stored in the storage device 22.

The first mesh conversion unit 13 converts the first mesh data into second mesh data in a large mesh size (a second mesh size, a large mesh size) which is suitable for the proximity effect correction (step 2). For instance, the large mesh size (the second mesh size) is n (n is an integer greater than or equal to 2) times the small mesh size (the first mesh size). For instance, when the small mesh size is 100 nm, the large mesh size is set to 1.6 µm.

Figure 4A:
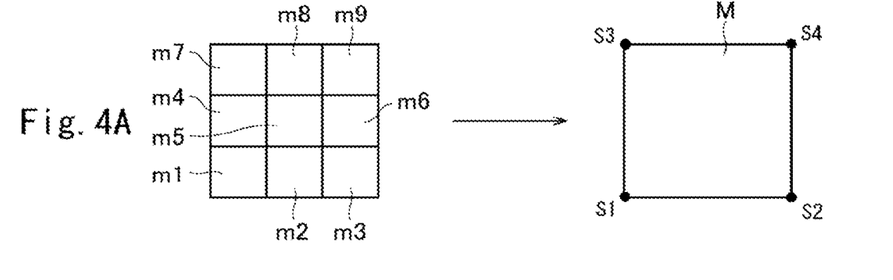
FIG. 4A and FIG. 4B are diagrams illustrating an example of mesh conversion.

For instance, as illustrated in FIG. 4A, a plurality of small mesh regions m1 to m9 are converted (combined) into one large mesh region M. The mesh value of the large mesh region M is calculated using the mesh values and positions of the small mesh regions m1 to m9. For instance, let the position (the vertex position at the lower left) of each small mesh region be (xi, yi), the mesh value be $s_i$, and the large mesh size be MeshSize, then the mesh values S1 to S4 associated with the vertices of the large mesh region M are determined by the following expressions.

$$gx = \sum_i \frac{s_i \times x_i}{si} \quad gy = \sum_i \frac{s_i \times y_i}{si}$$

-continued $$S = \sum_i si$$

$$Sgx = \frac{S*gx}{MeshSize} \quad Sgy = \frac{S*gy}{MeshSize}$$

$$S4 = (Sgx + Sgy)/2 - (S/4)$$

$$S3 = (Sgy - Sgx)/2 + (S/4)$$

$$S2 = (Sgx - Sgy)/2 + (S/4)$$

$$S1 = S - S2 - S3 - S4$$

$S_i$ indicates the area·dose amount in the ith small mesh region.

The first convolution operation unit 14 uses the second mesh data as an input, performs a convolution operation on a proximity effect correction kernel, and generates third mesh data (step 3). The mesh value of the third mesh data provides an irradiation amount with the proximity effect corrected.

Similarly to the second mesh data, the third mesh data is mesh data in a large mesh size. The second mesh conversion unit 15 converts the third mesh data into fourth mesh data in a small mesh size (step 4). The small mesh size is necessary for the middle range effect correction. In short, the first mesh data and the fourth mesh data have the same mesh size.

Figure 4B:
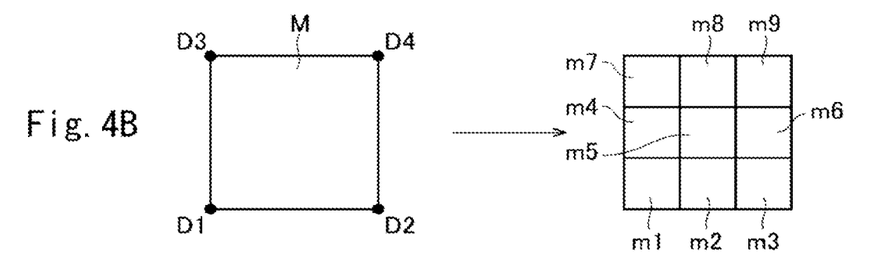

For instance, as illustrated in FIG. 4B, one large mesh region M is converted (divided) into a plurality of small mesh regions m1 to m9. The mesh values of the small mesh regions m1 to m9 are calculated by interpolation processing of mesh values D1 to D4 associated with the vertices of the large mesh region M. As an interpolation method at the time of performing the interpolation processing, a well-known interpolation method, such as a linear interpolation, may be used. The mesh values D1 to D4 are values after a convolution operation is performed on the mesh values S1 to S4.

The second convolution operation unit 16 uses the first mesh data as an input, performs a convolution operation on a middle range effect correction kernel, and generates fifth mesh data (step 5). The fifth mesh data is mesh data in a small mesh size. The mesh value of the fifth mesh data provides an irradiation amount with the middle range effect corrected.

The addition unit 17 adds the fourth mesh data and the fifth mesh data together, and calculates an irradiation amount for each small mesh region (step 6). The processing in steps 2 to 6 is repeated predetermined times (n times). In the repeat processing, an addition result obtained by the addition unit 17 provides an input to the first mesh conversion unit 13 and the second convolution operation unit 16.

When the processing in steps 2 to 6 is repeated n times, for instance, three times or so (Yes in step 7), writing processing is performed (step 8). The writing controller 18 controls a writer W via the deflection control circuit 24, and performs writing processing. The writer W writes a pattern on the substrate 70 using an electron beam B in the irradiation amount calculated by the addition unit 17. For instance, the deflection control circuit 24 divides the irradiation amount by a beam current to calculate an irradiation time for each shot, and controls the irradiation time by applying a deflection voltage to the blanker 36.

In this manner, according to the present embodiment, the first mesh data in a small mesh size corresponding to the middle range effect correction is converted into the second mesh data in a large mesh size corresponding to the proximity effect correction, a convolution operation is performed on a proximity effect correction kernel, and the third mesh data is generated. Then, the third mesh data is converted into the fourth mesh data in a small mesh size. The fifth mesh data is generated by performing a convolution operation on the first mesh data with the middle range effect correction kernel. The fourth mesh data is added to the fifth mesh data.

Since the proximity effect has an influence range larger than that of the middle range effect, when a convolution operation is performed on mesh data in a small mesh size, the amount of calculation is huge, and a significant processing time is required. However, in the present embodiment, the first mesh data in a small mesh size is converted into the second mesh data in a large mesh size, then proximity effect correction calculation is performed by use of the second mesh data. Thus, the amount of calculation can be reduced, and the processing time can be shortened. Also, in addition to the proximity effect correction, the middle range effect correction is performed, thus it is possible to reduce the dimensional variation of a writing pattern.

Figure 5:
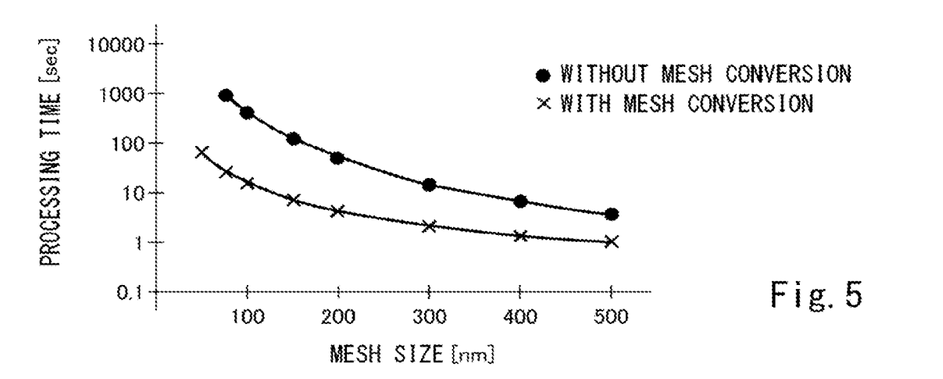
FIG. 5 is a graph illustrating an example of a relationship between mesh size and processing time.

FIG. 5 illustrates a relationship between small mesh size and processing time taken for the proximity effect correction and the middle range effect correction. The smaller the mesh size is, the longer the processing time is. For instance, when the small mesh size is 100 nm, as in the embodiment, it is seen that the processing time when mesh conversion to convert the first mesh data in a small mesh size into the second mesh data in a large mesh size is performed can be reduced to approximately ½₅ as compared with when mesh conversion is not performed.

Figure 6:
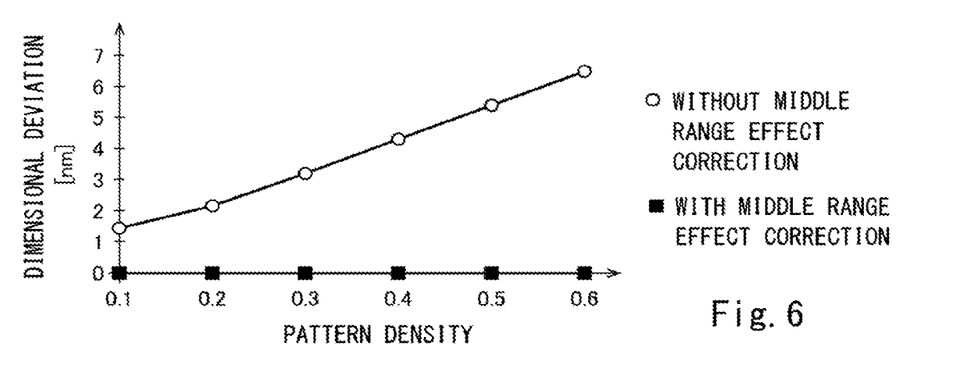
FIG. 6 is a graph illustrating an example of an amount of deviation of a pattern dimension between when the middle range effect correction is performed and when the middle range effect correction is not performed.

FIG. 6 illustrates an amount of dimensional deviation of a writing pattern between when the middle range effect correction is performed and when the middle range effect correction is not performed. The dimensional accuracy can be significantly improved by performing the middle range effect correction.

Figure 3:
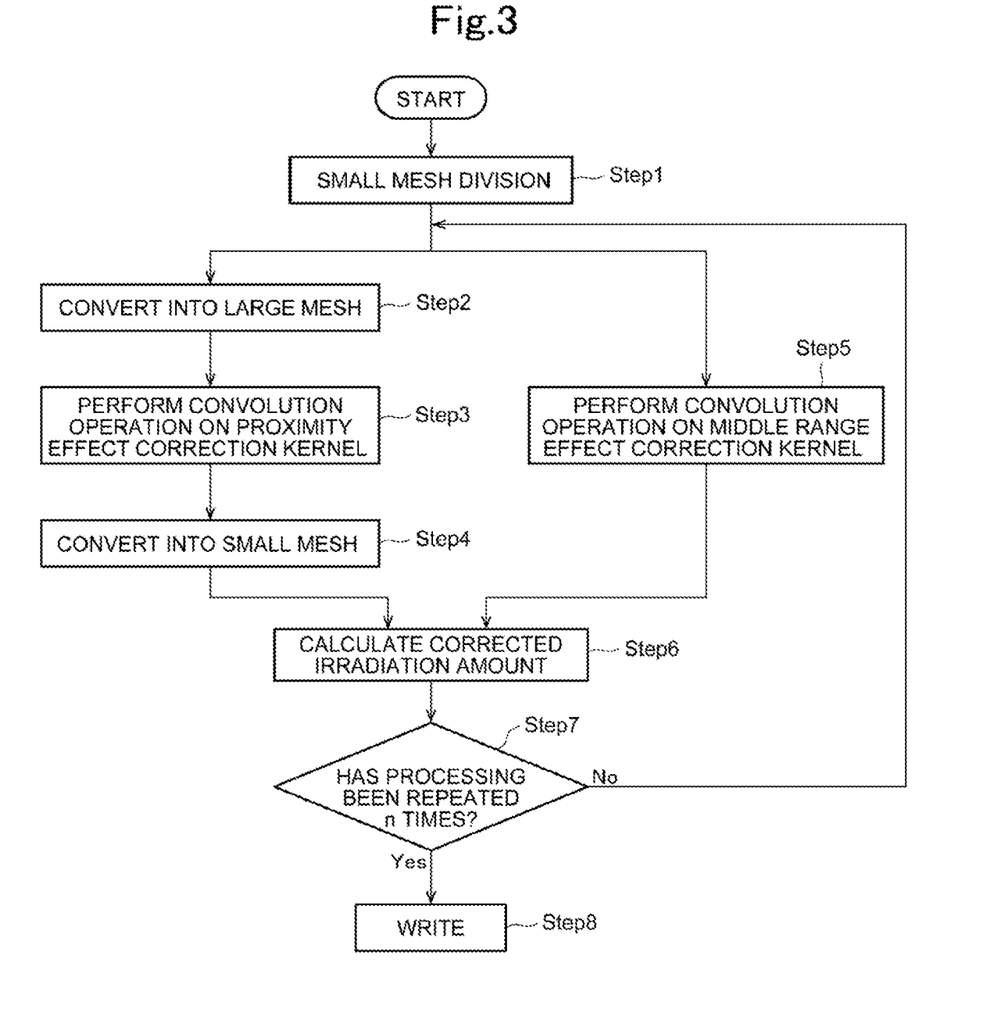
FIG. 3 is a flowchart illustrating a writing method according to the embodiment.

In the processing in step 2 of FIG. 3, for the large mesh region M with the mesh values S1 to S4 of 0, a calculation result is maintained, and when the processing in step 2 is performed again in the repeat processing, calculation processing for a mesh value may be skipped, and a mesh value of 0 may be set. Thus, the amount of calculation for correction processing can be reduced.

In the processing in step 1 of FIG. 3, for a small mesh region with the mesh value of 0, a calculation result is maintained, the interpolation processing in step 4 may be skipped, and the mesh value of a corresponding small mesh region may be set to 0. Thus, the amount of calculation for correction processing can be reduced.

Figure 7:
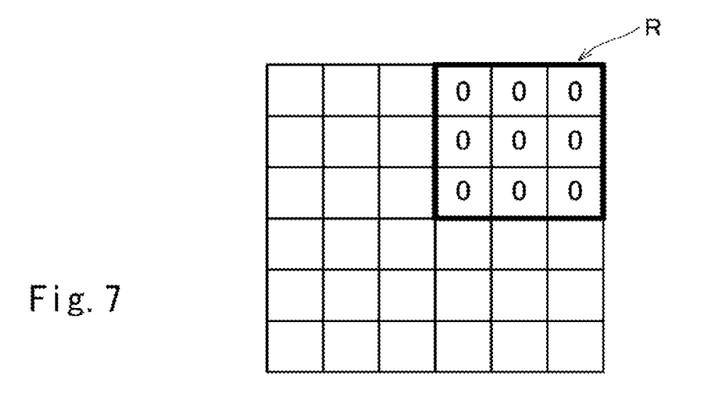
FIG. 7 is a figure illustrating an example of a region having mesh values of 0.

In general, the convolution operation in step 3 and step 5 of FIG. 3 is performed with a region divided in consideration of cache utilization efficiency of a CPU. As illustrated in FIG. 7, when the mesh data inputted to the first convolution operation unit 14 and the second convolution operation unit 16 includes a region R in which the mesh values are all 0, the convolution operation on this region may be skipped, and the mesh value of a corresponding region in the mesh data to be outputted may be set to 0. Thus, the amount of calculation for correction processing can be reduced.

Figure 8:
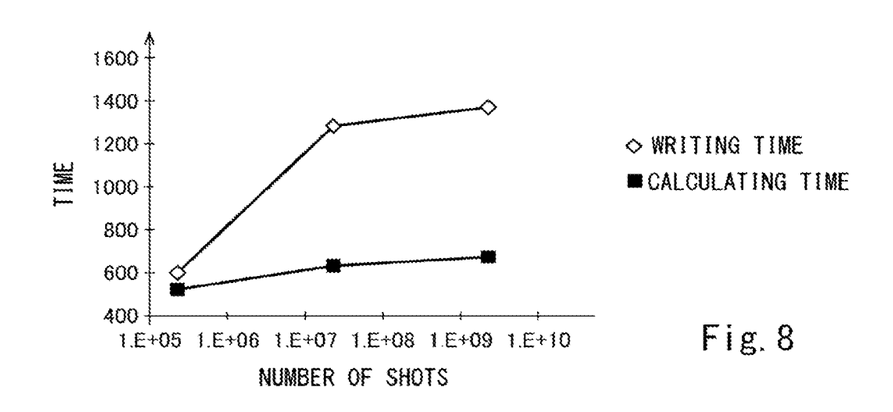
FIG. 8 is a graph illustrating an example of a relationship between writing speed and calculation speed of irradiation amount correction calculation.

The amount of calculation is reduced by skipping part of processing like this, thus even when the number of shots is small as illustrated in FIG. 8, the calculation time for the correction processing can be made shorter than the writing time, and the calculation processing can be performed within a practical time.

The writing apparatus is not limited to a variable shaping beam type, and may be a multi-beam writing apparatus that irradiates with a plurality of beams at once.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method for writing a pattern on a substrate using a charged particle beam in an irradiation amount to correct a proximity effect and a middle range effect having an influence radius shorter than an influence radius of the proximity effect, the method comprising:
   virtually dividing a writing region of the substrate into a plurality of first mesh regions in a first mesh size;
   calculating an area density of the pattern for each of the plurality of first mesh regions to generate first mesh data;
   converting a mesh size of the first mesh data into a second mesh size greater than the first mesh size to generate second mesh data;
   performing a convolution operation between the second mesh data and a proximity effect correction kernel to generate third mesh data;
   converting a mesh size of the third mesh data into the first mesh size to generate fourth mesh data;
   performing a convolution operation between the first mesh data and a middle range effect correction kernel to generate fifth mesh data;
   adding the fourth mesh data and the fifth mesh data together to calculate an irradiation amount of the charged particle beam for each of the plurality of first mesh regions; and
   writing the pattern on the substrate using the charged particle beam in the calculated irradiation amount.

2. The method according to claim 1,
   wherein the calculated irradiation amount of the charged particle beam for each of the plurality of first mesh regions is utilized as the first mesh data, and the steps of generating the first mesh data, generating the second mesh data, generating the third mesh data, generating the fourth mesh data, generating the fifth mesh data, and calculating an irradiation amount of the charged particle beam for each of the plurality of first mesh regions are repeated a plurality of times.

3. The method according to claim 2,
   wherein when at a time of generating the second mesh data for a first time, a mesh region is present in which a mesh value is 0, in a step of generating the second mesh data for a second time or later, a mesh value of a corresponding mesh region is set to 0.

4. The method according to claim 1,
   wherein a mesh value of a mesh region corresponding to a first mesh region having an area density of 0 in the first mesh data is set to 0 to generate the fourth mesh data.

5. The method according to claim 1,
   wherein the second mesh size is n (n is an integer greater than or equal to 2) times the first mesh size.

6. The method according to claim 1,
   wherein the plurality of first mesh regions are combined to generate the second mesh data including a second mesh region, and
   a mesh value of the second mesh region is calculated from area densities of the plurality of first mesh regions included in the second mesh region.

7. A charged particle beam writing apparatus that writes a pattern on a substrate using a charged particle beam in an irradiation amount to correct a proximity effect and a middle range effect having an influence radius shorter than an influence radius of the proximity effect, the charged particle beam writing apparatus comprising:
   a mesh division unit virtually dividing a writing region of the substrate into a plurality of first mesh regions in a first mesh size;
   an area density calculation unit that calculates an area density of the pattern for each of the plurality of first mesh regions to generate first mesh data;
   a first mesh conversion unit converting a mesh size of the first mesh data into a second mesh size greater than the first mesh size to generate second mesh data;
   a first convolution operation unit performing a convolution operation between the second mesh data and a proximity effect correction kernel to generate third mesh data;
   a second mesh conversion unit converting a mesh size of the third mesh data into the first mesh size to generate fourth mesh data;
   a second convolution operation unit performing a convolution operation between the first mesh data and a middle range effect correction kernel to generate fifth mesh data;
   an addition unit adding the fourth mesh data and the fifth mesh data together to calculate an irradiation amount of the charged particle beam for each of the plurality of first mesh regions; and
   a writer writing the pattern on the substrate using the charged particle beam in the calculated irradiation amount.

8. The apparatus according to claim 7,
   wherein the calculated irradiation amount of the charged particle beam for each of the plurality of first mesh regions is utilized as the first mesh data, and processes of generating the first mesh data, generating the second mesh data, generating the third mesh data, generating the fourth mesh data, generating the fifth mesh data, and calculating an irradiation amount of the charged particle beam for each of the plurality of first mesh regions are repeated a plurality of times.

9. The apparatus according to claim 8,
   Wherein when at a time of generating the second mesh data for a first time, a mesh region is present in which a mesh value is 0, at a time of generating the second mesh data for a second time or later, the first mesh conversion unit sets a mesh value of a corresponding mesh region to 0.

10. The apparatus according to claim 7,
    wherein a mesh value of a mesh region corresponding to a first mesh region having an area density of 0 in the first mesh data is set to 0 to generate the fourth mesh data.

11. The apparatus according to claim 7,
    wherein the second mesh size is n (n is an integer greater than or equal to 2) times the first mesh size.

12. The apparatus according to claim 7,
wherein the first mesh conversion unit combines the plurality of first mesh regions to generate the second mesh data including a second mesh region, and
calculates a mesh value of the second mesh region from area densities of the plurality of first mesh regions included in the second mesh region.

\* \* \* \* \*